(12) United States Patent
Chen et al.

(10) Patent No.: US 7,943,454 B2
(45) Date of Patent: May 17, 2011

(54) METHOD FOR DUAL STRESS LINER

(75) Inventors: Xiangdong Chen, Poughquag, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 542 days.

(21) Appl. No.: 12/080,016

(22) Filed: Mar. 31, 2008

(65) Prior Publication Data
US 2008/0185657 A1   Aug. 7, 2008

Related U.S. Application Data

(63) Continuation of application No. 11/383,560, filed on May 16, 2006, now Pat. No. 7,361,539.

(51) Int. Cl.
*H01L 21/8238* (2006.01)

(52) U.S. Cl. .................. 438/199; 257/204; 257/E21.635

(58) Field of Classification Search .............. 438/199, 438/227, 778, 633, 635, 638, 761; 257/204, 257/274, E21.635, E21.632, E21.611
See application file for complete search history.

(56) References Cited

U.S. PATENT DOCUMENTS

| | | | |
|---|---|---|---|
| 6,214,709 B1 | 4/2001 | Chen | |
| 6,709,935 B1 | 3/2004 | Yu | |
| 6,737,308 B2 | 5/2004 | Kim | |
| 6,890,808 B2 | 5/2005 | Chidambarrao et al. | |
| 6,984,564 B1 | 1/2006 | Huang et al. | |
| 7,002,209 B2 | 2/2006 | Chen et al. | |
| 2003/0181005 A1 | 9/2003 | Hachimine et al. | |
| 2004/0029323 A1 | 2/2004 | Shimizu et al. | |
| 2005/0104095 A1 | 5/2005 | Ng et al. | |
| 2005/0158937 A1 | 7/2005 | Yang et al. | |
| 2005/0158955 A1 | 7/2005 | Yang et al. | |
| 2005/0214998 A1 | 9/2005 | Chen et al. | |
| 2005/0242340 A1 | 11/2005 | Chidambarrao et al. | |
| 2006/0099793 A1 | 5/2006 | Yang et al. | |

*Primary Examiner* — David Vu
(74) *Attorney, Agent, or Firm* — Daryl K. Neff; H. Daniel Schnurmann

(57) ABSTRACT

A semiconductor device structure is provided which includes a first field effect transistor ("FET") having a first channel region, a first source region, a first drain region and a first gate conductor overlying the first channel region. A second FET is included which has a second channel region, a second source region, a second drain region and a second gate conductor overlying the second channel region. The first and second gate conductors can be portions of a single elongated conductive member extending over both the first and second channel regions. A first stressed film may overlie the first FET and the first stressed film may apply a stress having a first value to the first channel region. A second stressed film may overlie the second FET and the second stressed film may apply a stress having a second value to the second channel region. The second value is substantially different from the first value. The first and second stressed films can abut each other at a common boundary and present a substantially co-planar major surface at the common boundary.

15 Claims, 7 Drawing Sheets

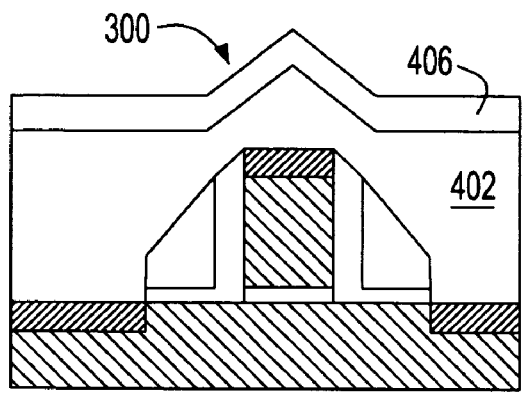
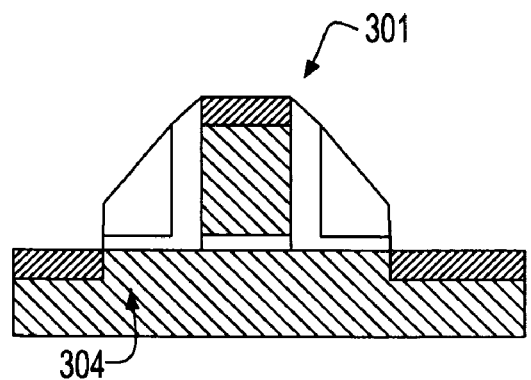
FIG. 6A
FIG. 6B
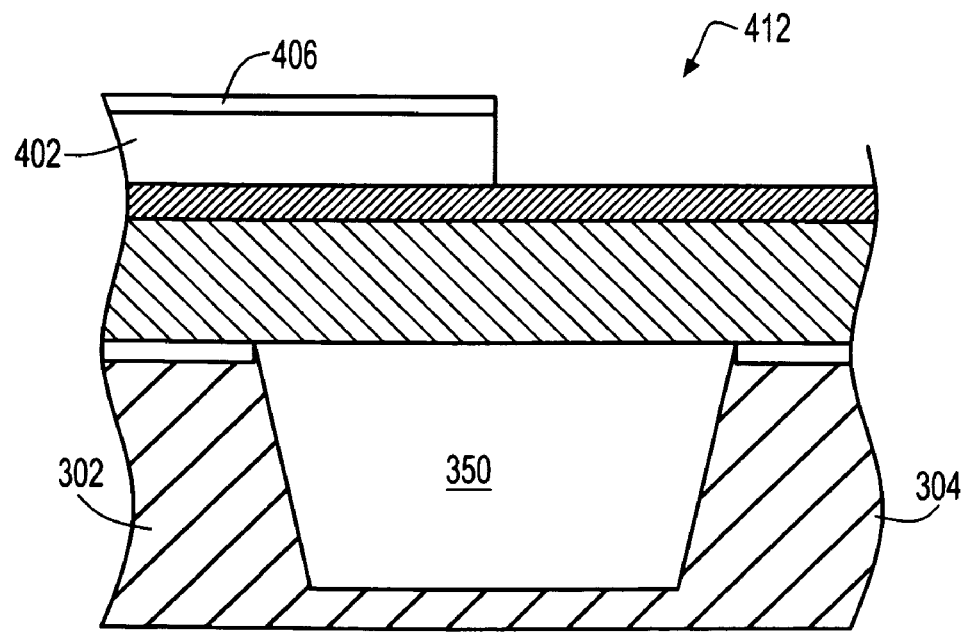
FIG. 6C

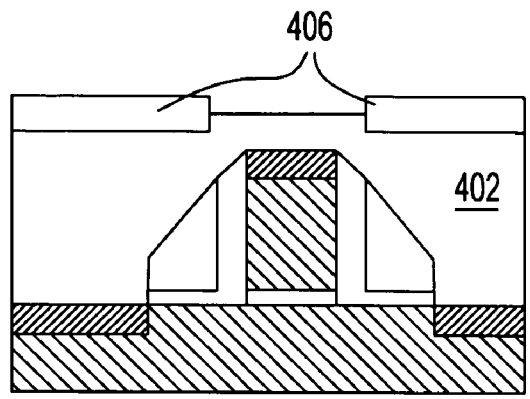
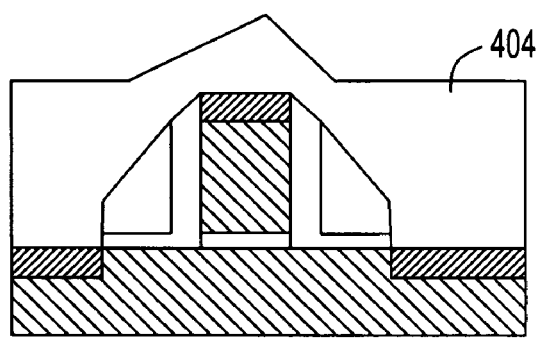
FIG. 8A  FIG. 8B
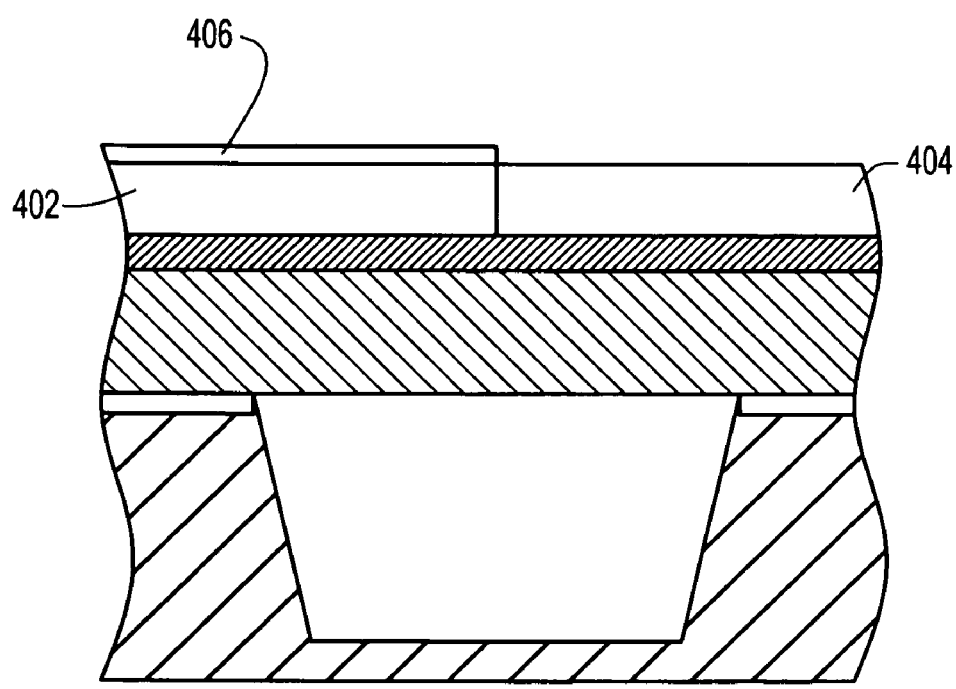
FIG. 8C

METHOD FOR DUAL STRESS LINER

CROSS-REFERENCE TO RELATED APPLICATION

This application is a continuation of U.S. application Ser. No. 11/383,560 filed May 16, 2006, the disclosure of which is hereby incorporated herein by reference.

BACKGROUND OF THE INVENTION

The present invention relates to semiconductor devices and their fabrication and more particularly to semiconductor devices in which a stress is applied to the semiconductor device.

In fabricating integrated circuits in conventional bulk semiconductor wafers, wells of either p-type or n-type conductivity are implanted in a substrate of the opposite conductivity. However, in complementary metal oxide semiconductor (CMOS) technology, both p-type and n-type wells are utilized. Source/drain regions are formed by implanting diffusion regions of the opposite n-type or p-type conductivity as the wells to form metal-oxide-semiconductor field effect transistors (MOSFETs). The carrier mobility in a transistor can be increased when a stress of sufficient magnitude is applied to the conduction channel of a transistor to create a strain therein. An increase in the performance of an n-type field effect transistor (NFET) can be achieved by applying a tensile longitudinal stress to the conduction channel of the NFET. An increase in the performance of a p-type field effect transistor (PFET) can be achieved by applying a compressive longitudinal stress to the conduction channel of the PFET.

A stress-imparting film, also referred to herein as a "stressed" film, can be deposited to cover a semiconductor device region to impart a stress thereto for enhancing the conductivity of a transistor, for example, an NFET or a PFET device. Silicon nitride is one material, among others, which can be deposited in such way that the resulting material layer imparts either a tensile stress or a compressive stress to a layer of a second material with which it is in contact. To improve the conductivity of both an NFET and a PFET, a tensile stress-imparting nitride can be formed to cover an NFET device region and a compressive stress-imparting nitride can be formed to cover a PFET device region.

From a fabrication point of view, such a goal can be accomplished by applying two films, each having a different internal stress. In such case, one stressed film 102 can be patterned with an overlying oxide layer 103, after which a second film 104 is deposited and then patterned to produce the overlapped films 100 at the boundary 220, as illustrated in the cross-sectional depiction of FIG. 1. The overlapped films 100, however, can create certain problems.

One such problem concerns the fabrication of a contact via 210 through dielectric layer 212 for conductively contacting the silicided polysilicon conductor 225 overlying a shallow trench isolation (STI) region 110 at the boundary 220 between two differently stressed films 102, 104. The etching of the contact hole at that boundary 220 can be difficult to perform while etching other contact holes, such as the contact hole for contact via 230 to the silicide region 203 that overlies the active device region 202 (FIG. 2). The difficulty arises because of the difference between the relatively large thickness of the aggregated films 102, 103 and 104 that overlie the silicided polyconductor 225, as compared to the smaller thickness of the stressed film 102 which overlies the silicide layer 203 above the active device region 202.

Because of this difference in the total film thicknesses, the contact hole for the contact via 210 is less likely to be etched to a sufficient depth to properly contact the silicided polysilicon conductor 225. A contact open failure can result, as best seen at 220 in FIG. 1. A contact open failure is one in which much higher than normal contact resistance occurs at the interface between the contact via 210 and the polysilicon conductor. A contact open failure can occur when the contact hole fails to be etched sufficiently to contact the silicide layer 222. On the other hand, extending the etching depth to prevent a contact open failure with respect to the contact via 210 could also cause the silicide region 203 and/or the active device region 202 to be excessively over-etched. It is desirable that the contact hole for forming the contact via 230 be etched to a depth that falls just below the major surface 205 of the silicide region 203. When the contact hole is over-etched excessively, i.e., to a depth below the silicide layer 203, the semiconductor device region 202 can exhibit excessive junction leakage.

Consequently, a need exists for a structure and an associated method of fabricating a semiconductor device in which more than one stressed film can be provided, while permitting contact holes to both the silicided polyconductor and to the active device region to be etched with less difficulty.

SUMMARY OF THE INVENTION

According to an aspect of the invention, A semiconductor device structure is provided which includes a first field effect transistor ("FET") having a first channel region, a first source region, a first drain region and a first gate conductor overlying the first channel region. A second FET is included which has a second channel region, a second source region, a second drain region and a second gate conductor overlying the second channel region. The first and second gate conductors can be portions of a single elongated conductive member extending over both the first and second channel regions. A first stressed film may overlie the first FET and the first stressed film may apply a stress having a first value to the first channel region. A second stressed film may overlie the second FET and the second stressed film may apply a stress having a second value to the second channel region. The second value is substantially different from the first value. The first and second stressed films may abut each other at a common boundary and present a substantially co-planar major surface at the common boundary.

BRIEF DESCRIPTION OF THE DRAWINGS

FIGS. 6A, 6B and 6C are respective corresponding views illustrating a stage of fabricating the structure shown in FIG. 3 subsequent to the stage of fabrication illustrated in FIGS. 5A, 5B and 5C.

FIGS. 8A, 8B and 8C are respective corresponding views illustrating a stage of fabricating the structure shown in FIG. 3 subsequent to the stage of fabrication illustrated in FIGS. 7A, 7B and 7C.

DETAILED DESCRIPTION

Figure 2:
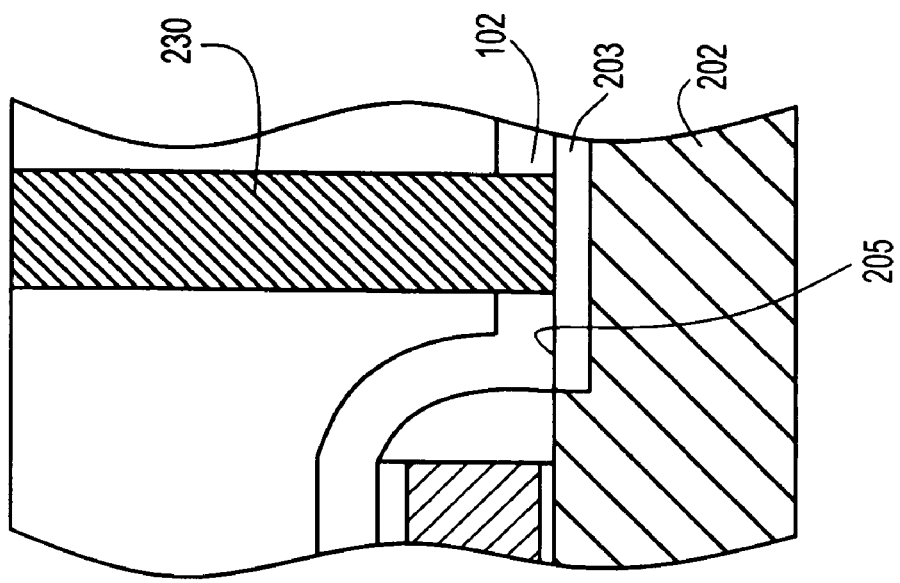
FIG. 2 is a sectional view illustrating a different location of the prior art semiconductor device structure shown in FIG. 1, at which a second conductive contact via is to be formed.
Figure 1:
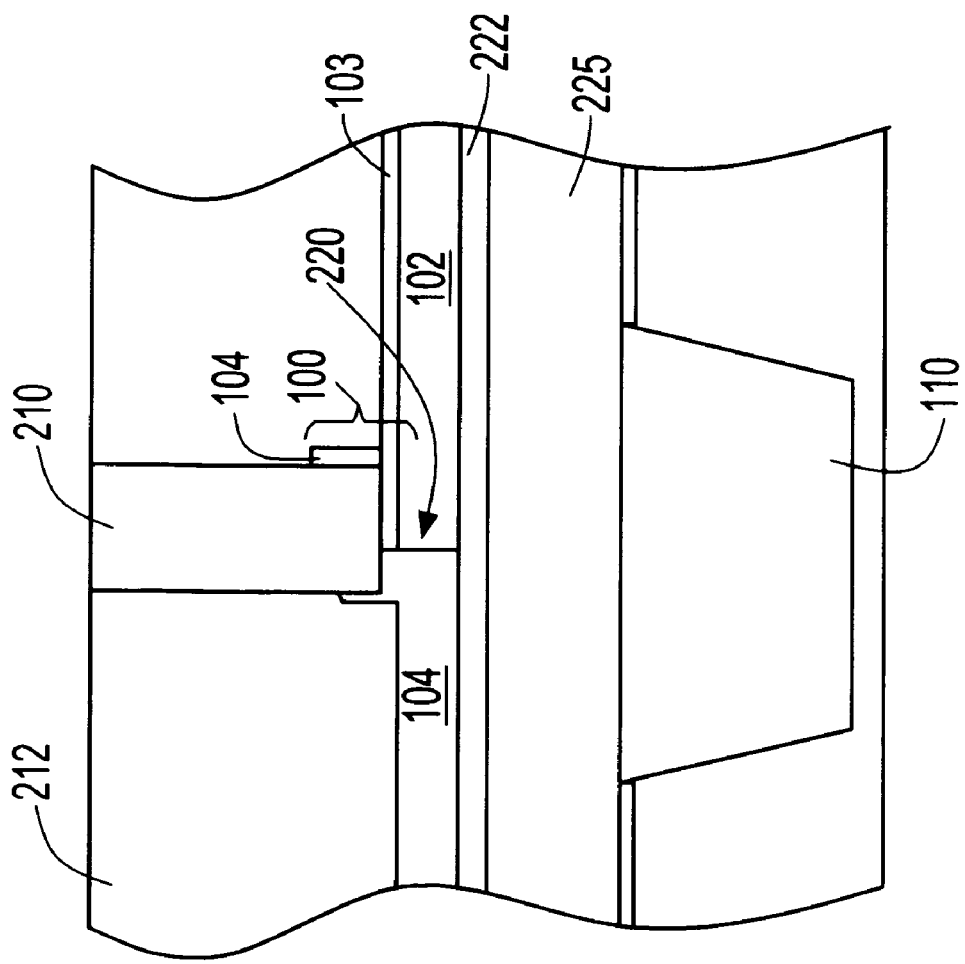
FIG. 1 is a sectional view illustrating a semiconductor device structure in accordance with the prior art over which two films, each having a different internal stress are applied and patterned to create an overlapped boundary, at which a first conductive contact via is to be formed.
Figures 3, 4:
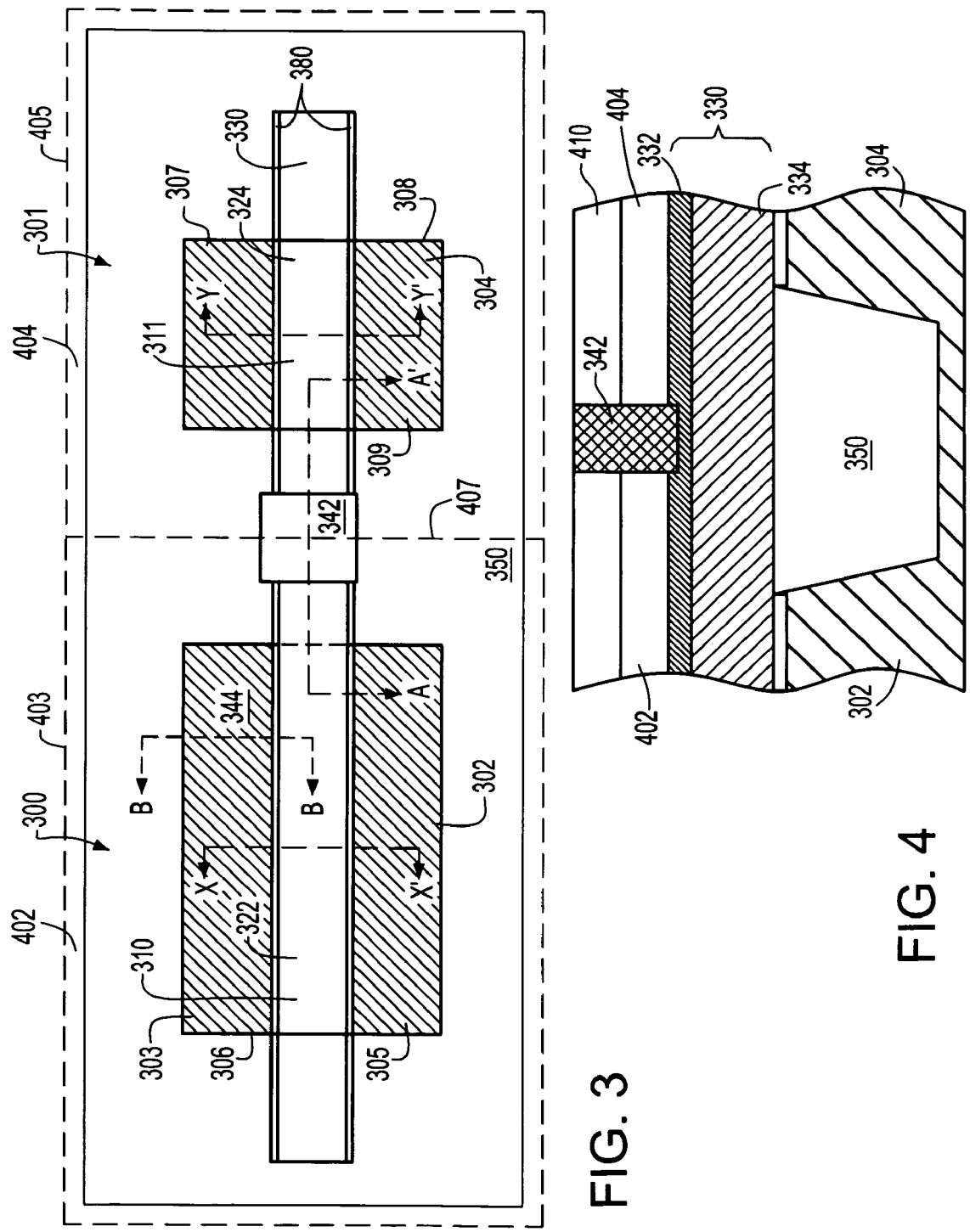
FIG. 3 is a top-down plan view illustrating a structure including first and second transistors with abutting stressed films, in accordance with one embodiment of the present invention.
FIG. 4 is a partial sectional view through line A-A' illustrating the structure shown in FIG. 3.

FIG. 3 is a top-down illustrating an embodiment of the present invention. As illustrated in FIG. 3, semiconductor device regions 302, 304 are provided in a semiconductor substrate. In the embodiment of FIG. 3, the semiconductor device regions 302, 304 preferably are isolated from each other by an isolation structure such as a shallow trench isolation ("STI") 350 which extends downwardly from a major surface of the substrate and surrounds each of the individual regions 302, 304. A p-type field effect transistor ("PFET") has a source region 303, a drain region 305 and a source-drain conduction path in region 302 extending between the source region and the drain region, the conduction path extending through a channel region 310 of the PFET. An n-type field effect transistor ("NFET") has a source region 307, a drain region 309 and a source-drain conduction path in region 304 extending between the source region and the drain region, the conduction path extending through a channel region 311 of the NFET.

The semiconductor device regions 302, 304 preferably are single-crystal semiconductor regions of a substrate, the substrate being either a bulk substrate or a semiconductor-on-insulator substrate ("SOI"). In a SOI substrate, a relatively thin single-crystal semiconductor region is provided as a device region over an insulating layer. When the source-drain conduction channels of FETs are provided in a SOI layer, faster switching operation can often be achieved as compared to when the source-drain conduction channels of FETs are provided in bulk semiconductor regions, because junction capacitance between the active device region of transistor and the bulk semiconductor region is reduced or eliminated.

A conducting member 330 includes portions functioning as the gate conductors 322 and 324 of the PFET and the NFET respectively. Thus, the conducting member extends over the channel region 310 of the PFET and over the channel region of the NFET. The conducting member also extends over the STI region 350 provided between the two semiconductor regions. Thus, the conducting member extends over both semiconductor regions 302, 304 to traverse them from an outer end 306 of the PFET device region 302 to the outer end 308 of the NFET device region 304. The conducting member 330 also maintains the gate conductors 322, 324 at a common potential for both NFET and PFET. The conducting member can include either a single layer or multiple layers. In one embodiment of the present invention, the conducting member includes a polycrystalline semiconductor layer. In such case, the conducting member is referred to as "polyconductor" (PC). In another embodiment, the current conducting member includes both such polyconductor and a layer of silicide overlying the polyconductor. Preferably, the conducting member 330 is a "polyconductor" which includes polysilicon to provide workfunction matching, the polyconductor functioning as the transistor gates for both the PFET and NFET. Further details of such multi-layer current conducting member are described below.

Dielectric spacers 380, which preferably include an oxide of silicon as at least an outermost layer, are disposed on sidewalls of the conducting member. Stressed films 402, 404 overlie the device regions 302, 304 and the conducting member 330. The dimensions of the stressed films need not be as shown in FIG. 3, in that the stressed films can occupy smaller or larger areas. The locations of the edges 403, 405 of the stressed films need not be as shown, and need not be aligned with each other. However, in any case, the stressed films 402, 404 abut each other at a common boundary 407 which overlies the STI region between the two semiconductor regions 302, 304.

As also illustrated in FIG. 3, a contact via 342 is provided in conductive communication with the conducting member 330. A separate contact via to the source region of the PFET is illustrated at 344. For ease of reference, only one such contact 344 via to the source of the PFET is illustrated in FIG. 3. Typically, contacts similar to that shown at 344 are provided to both the source and drain regions of both the PFET and NFET. Such contact vias 342, 344 are made by forming contact holes at the respective locations and subsequently filling them with a conductive material. Preferably, the conductive material includes one or more metals or conductive compounds of metals and may include one or more materials selected for their properties in enhancing adhesion between the conductive via 342 and the conducting member 330 and/or in forming a barrier against electromigration or other movement of molecules of conductive materials between the conductive via 342 and the conducting member 330.

FIG. 4 is a cross-sectional view, through line A-A, of the embodiment shown in FIG. 3. As illustrated in FIG. 4, the conducting member 330 preferably has multiple layers with a first layer 334 including a material such as doped polysilicon and a low-resistance second layer 332 including a low resistance conducting material such as one or more metals or conductive compounds of metals. Preferably, the low-resistance second layer 332 includes a conductive silicide of a metal. The conductive silicide can include one or more of tungsten silicide, nickel silicide, cobalt silicide or titanium silicide, among others.

The first stressed film 402 preferably has an internal compressive stress such that it applies a compressive stress to the semiconductor region 302 of the PFET with which it is in contact. Preferably, such stressed film 302 enhances the performance of the PFET. The second stressed film 404 preferably has an internal tensile stress such that it applies a tensile stress to the semiconductor region 304 of the NFET with which it is in contact. Similarly, such stressed film 304 enhances the performance of the NFET. Preferably, the stressed film includes a material such as silicon nitride ($Si_3N_4$). By varying the conditions (e.g., vapor pressure and temperature) under which a silicon nitride is deposited, a stressed film can be formed which has a particular type of internal stress (i.e., either compressive or tensile) and a particular magnitude of such stress. These parameters, i.e., stress type and magnitude, can be referred to collectively as the "value" of the stress.

Figure 5A:
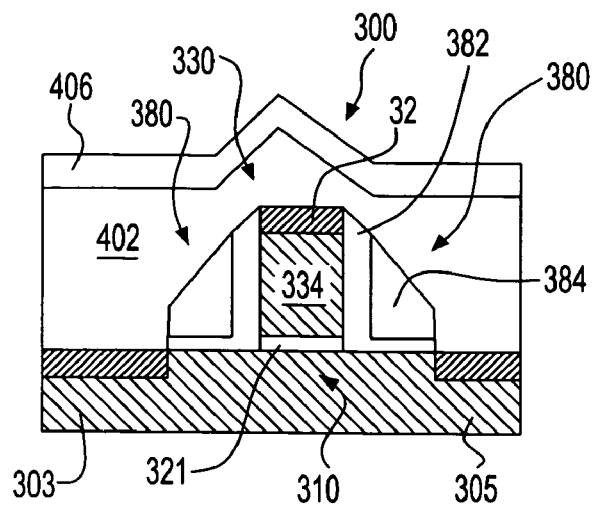
FIG. 5A is a partial sectional view through line X-X' of FIG. 3, illustrating a particular stage of fabricating the structure shown in FIG. 3.
Figure 5B:
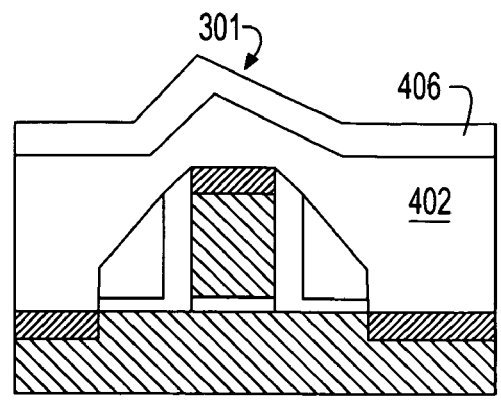
FIG. 5B is a corresponding partial sectional view through line Y-Y' of FIG. 3, further illustrating the particular stage of fabricating the structure shown in FIG. 3.
Figure 5C:
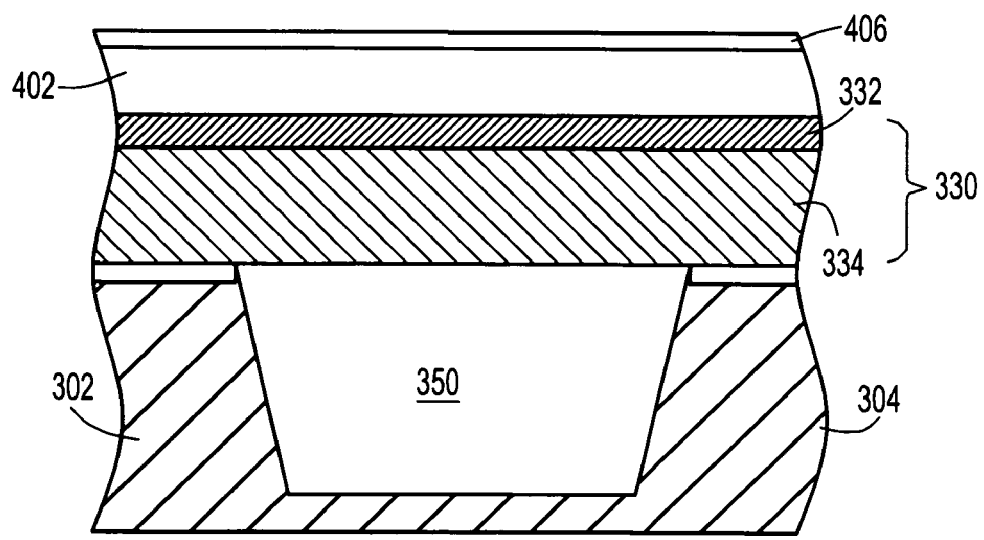
FIG. 5C is a corresponding partial sectional view through line A-A' of FIG. 3, further illustrating the particular stage of fabricating the structure shown in FIG. 3.

A preferred method of fabricating the structure illustrated in FIGS. 3 and 4 will now be described. Referring to FIGS. 5A, 5B and 5C, in a particular stage of fabrication, the PFET 300 and NFET 301 have already been formed. A first stressed film 402 having an internal stress with a first value is deposited to cover the PFET 300 and the NFET 301. Preferably, the stressed film includes silicon nitride, preferably being stoichiometric silicon nitride ($Si_3N_4$).

As particularly shown in FIG. 5A, the conducting member 330 functions as a gate conductor of the PFET 300, the conducting member including a polyconductor portion 334 and a low-resistance layer 322 overlying the polyconductor portion. The conducting member 330 is spaced from the channel region 310 by a gate dielectric 321 and is flanked by dielectric spacers 380. As also shown in FIG. 5A, each dielectric spacer 380 has a dual structure including a first spacer 382 having an L-shape and a second spacer 384 overlying the L-shaped spacer. The first L-shaped spacer preferably includes or consists essentially of an oxide such as an oxide of silicon, e.g., silicon dioxide. The second spacer preferably includes silicon nitride; however, alternatively, the second spacer can include an oxide of silicon such as silicon dioxide. A similar structure is illustrated in FIG. 5B, in which the conducting member 330 overlies the channel region 310 of the NFET.

Preferably, the stressed film 402 is formed in such way that it covers each of the source region 303, drain region 305, and the conducting member 330 to a height above the channel region 310 which exceeds that of the conducting member. To achieve this result, it may be necessary to utilize a process in which the stressed film material is deposited by a combined process of deposition and etching. In one exemplary process, the stressed film material can be initially deposited under a first set of deposition conditions in which deposition predominates over etching. Subsequently, the deposition conditions are altered such that etching becomes predominant. Typically, an additional deposition step raises the height of the stressed film to the desirable level. Alternatively, the initial cycle of one deposition step followed by one etching step can be followed by one or more additional cycles of deposition and etching to form the stressed film 402.

After forming the stressed film 402 to the desired height above the channel region 310 (FIG. 5A), a stop layer 406 is then deposited to overlie the first stressed film 402. The stop layer 406 preferably is formed as a conformal layer, i.e., a layer which conforms to the topography of the stressed film 402 which it covers. Alternatively, the stop layer can be of the planarizing type which tends to fill gaps and reduce topography. The stop layer preferably is formed by a low temperature oxide ("LTO") deposition, which may include deposition using a TEOS (tetraethylorthosilicate) precursor, or alternatively a silane precursor. In a particular embodiment, the stop layer can be formed by deposition of doped or undoped silicate glass. In another embodiment, the stop layer can be formed by deposition and subsequent baking of a spin-on-glass material.

FIG. 5C illustrates the first stressed film 402 and stop layer 406 overlying the stressed film, as results at a location of the structure where later a conductive via will be formed to contact at least one of the low-resistance layer 332 or the polyconductor portion 334 of the conducting member 330, as overlies an STI region 350 between the first and second semiconductor regions 302, 304.

As further illustrated in FIGS. 6A, 6B and 6C, after the first stressed film 402 is formed, the stop layer 406 and first stressed film are selectively removed from the structure where they overlie the second semiconductor region 304. The stop layer 406 and film 402 is also removed from the structure where it overlies a portion 412 of the STI region 350 (FIG. 6C) that separates the first semiconductor region 302 from the second semiconductor region 304. This step is performed, for example, by depositing and photolithographically patterning a photoresist to provide an opening which exposes a portion of the stop layer and the first stressed film. Thereafter, the stop layer 406 and the first stressed film 402 are removed by selective etching, for example. Either wet or dry etching, e.g., reactive ion etching, can be used to remove these layers. At the conclusion of this step, the stop layer 406 and the first stressed film 402 remain in place overlying the PFET 300 (FIG. 6A) but are removed from the NFET 301 (FIG. 6B).

Figure 7A:
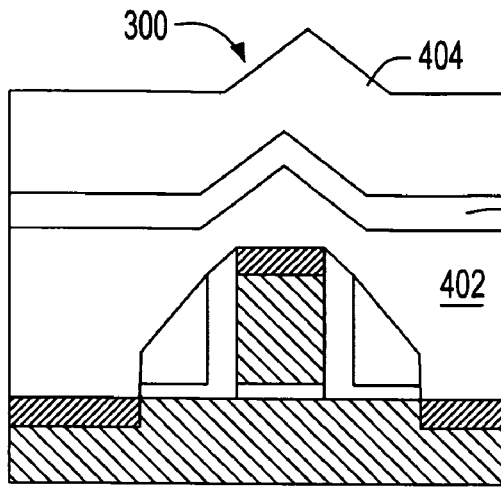
FIGS. 7A, 7B and 7C are respective corresponding views illustrating a stage of fabricating the structure shown in FIG. 3 subsequent to the stage of fabrication illustrated in FIGS. 6A, 6B and 6C.
Figure 7B:
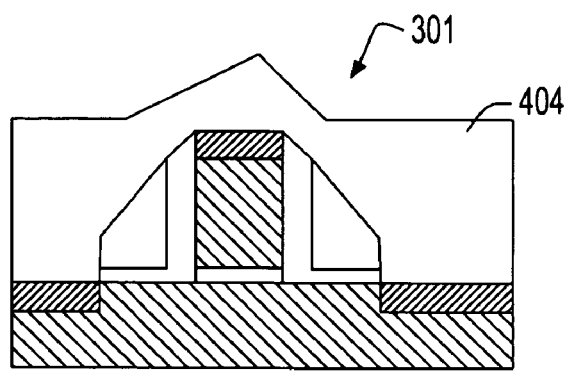
Figure 7C:
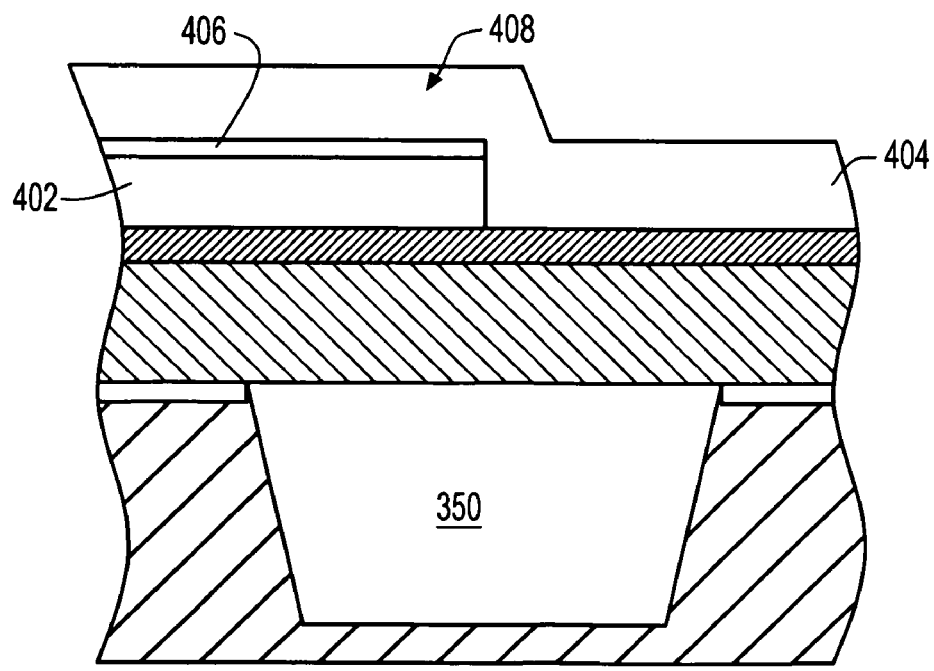

Thereafter, the second stressed film is formed. The second stressed film preferably has a tensile internal stress rather than a compressive internal stress which is characteristic of the first stressed film. Referring to FIGS. 7A, 7B and 7C, the second stressed film 404 is formed to overlie the NFET 301, the PFET 300, as well as the stop layer 406 and the first stressed film 402 which cover the PFET 300. As initially formed, the second stressed film 404 typically conforms to topography including the conducting member 330 which underlies it. However, as in the case of the first stressed film, the second stressed film may have a planarizing property which reduces the topography of the stressed film in relation to the topography which underlies it. As in the case of depositing the first stressed film 402, the second stressed film can be formed by successive deposition and etching steps, such as a sequence of a deposition step followed by an etching step followed by another deposition step, for example. As illustrated in FIG. 7C, at the conclusion of this step of processing, a portion 408 of the second stressed film 404 overlaps the stop layer 406 and the first stressed film 402 above the STI region 350.

Next, as illustrated in FIGS. 8A, 8B and 8C, further processing is performed to planarize the structure, in a manner that stops on the stop layer 406. Preferably, a chemical mechanical polishing ("CMP") process is applied to an exposed surface of the substrate. In such way, the CMP process removes topography of the first stressed film 402 and the second stressed film 404. In addition, the CMP process effectively removes the portion of the second stressed film that overlies the stop layer 406, such that the structure is as illustrated in FIG. 8A. In such way, the CMP process planarizes the first and second stressed films 402, 404. At the conclusion of this stage of fabrication, the structure is as illustrated in FIGS. 8A, 8B and 8C.

Figure 9A:
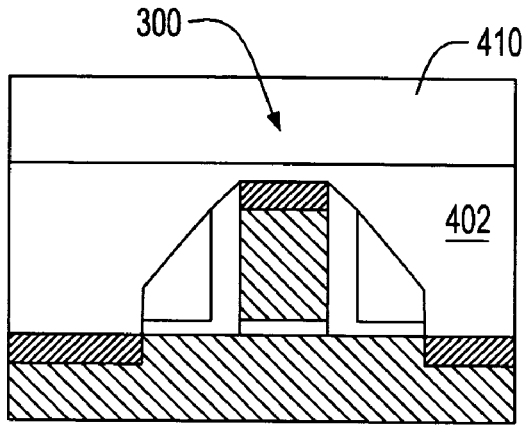
FIGS. 9A, 9B and 9C are respective corresponding views illustrating a stage of fabricating the structure shown in FIG. 3 subsequent to the stage of fabrication illustrated in FIGS. 8A, 8B and 8C.
Figure 9B:
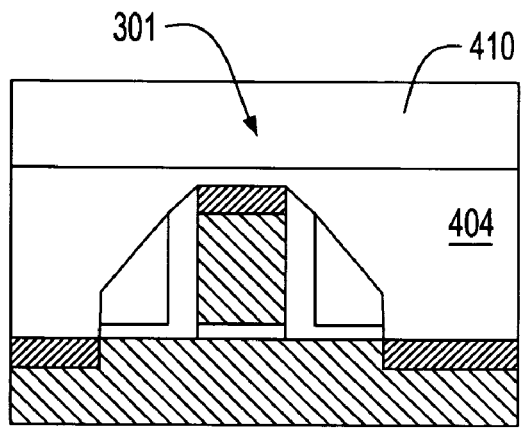
Figure 9C:
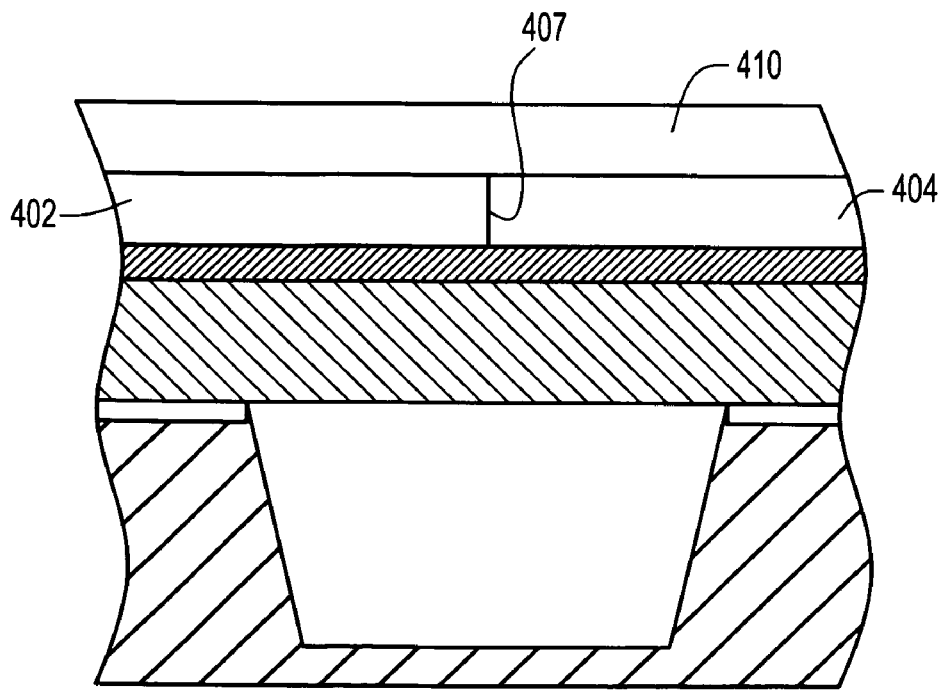

Thereafter, as further illustrated in FIGS. 9A, 9B and 9C, the stop layer preferably is removed from the structure, such as through wet chemical etching. Subsequently, an interlevel dielectric layer ("ILD") 410 is deposited to overlie the structure. However, when the stop layer consists essentially of an oxide, especially an oxide of silicon and the subsequently deposited ILD consists essentially of an oxide of silicon, the stop layer preferably is not removed prior to depositing the ILD. Preferably, the ILD is deposited to contact the first stressed film 402 overlying the PFET 300 (FIG. 9A) and such that the ILD contacts the second stressed film 404 overlying the NFET 301 (FIG. 9B). As particularly shown in FIG. 9C, the ILD overlies the boundary 407 where the first stressed film 402 abuts the second stressed film 404 and neither one of the stressed films overlaps the other stressed film. The ILD preferably includes an oxide. However, alternatively, the ILD can be formed by any suitable process which may include the deposition of an organic material, e.g., silicon low-K ("SILK") dielectric material.

After the ILD 410 is formed, a contact hole is etched to coincide with the boundary 407 between the first and second stressed films, after which the contact hole is filled with one or more metals or conductive compounds of metals to form the contact 342 is illustrated in FIGS. 3 and 4. Simultaneously, one or more contact holes are etched to contact at least one of the source and drain regions of each of the NFET and PFET transistors, and these one or more contact holes are filled with one or more metals or conductive compounds of metals to form one or more contact vias such as the contact hole shown at 344 in FIG. 3.

In a variation of the above-described method, the places of the NFET and the PFET are switched. In addition, the first stressed film preferably has a tensile stress while the second stressed film preferably has a compressive stress. In such case, the first stressed film remains as a stressor film overlying the NFET while the later formed second stressed film is formed to overlie the PFET.

From the foregoing described structure and method, the following advantages are apparent. The process of etching contact holes is improved because the first and second stressed films do not overlap and have uniform thickness both where they overlie the polyconductor and where they overlie the source region or drain region of each FET. Another advantage is that the first and second stressed films can be made thicker than was possible heretofore. Thicker stressed films can impart greater stress than heretofore because of their greater thickness covering the source and drain regions of each FET. A third advantage is that only one photomask is used to define the locations of the first and second stressed films and only one masking step is needed to define the common boundary between the first and second stressed films.

While the invention has been described in accordance with certain preferred embodiments thereof, many modifications and enhancements can be made thereto without departing from the true scope and spirit of the invention, which is limited only by the claims appended below.

What is claimed is:

1. A method of fabricating a semiconductor device structure, comprising:
    forming a first field effect transistor ("FET") and a second FET, the first FET having a first gate conductor and the second FET having a second gate conductor, the first and second gate conductors being portions of a single elongated conductive member;
    forming a first stressed film overlying said first and second FETs, said first stressed film applying a stress having a first value to a channel region of said first FET to enhance performance of said first FET;
    forming a stop layer to overlie said first stressed film;
    removing a portion of said first stressed film which overlies said second FET;
    forming a second stressed film to overlie said second FET, said second stressed film applying a stress having a second value to said second FET to enhance performance of said second FET;
    planarizing said first and second stressed films until said stop layer is exposed, such that said first and second stressed films abut each other at a common boundary and present a substantially co-planar major surface at said common boundary.

2. The method as claimed in claim 1, wherein the planarizing step is performed until said first stressed film is at least partially exposed.

3. The method as claimed in claim 2, wherein the step of forming the stop layer includes forming a protruding portion of the stop layer overlying and conforming to a protruding portion of said first stressed film, wherein the planarizing step exposes said protruding portion of said first stressed film.

4. The method as claimed in claim 1, wherein neither one of said first and second stressed films overlaps the other one of said first and second stressed films at said common boundary.

5. The method as claimed in claim 4, further comprising forming an interlevel dielectric layer ("ILD") overlying said first and second stressed films, and forming a conductive via extending through said ILD and said first and second stressed films at said common boundary to contact said conducting member.

6. The method as claimed in claim 1, further comprising forming an interlevel dielectric layer ("ILD") overlying said first and second stressed films, and forming a conductive via extending through said ILD and contacting said conducting member.

7. The method as claimed in claim 1, wherein said first FET is a p-type FET ("PFET"), said second FET is an n-type ("NFET"), said first value is compressive and said second value is tensile.

8. The method as claimed in claim 1, wherein said first FET is a n-type FET ("NFET"), said second FET is an p-type FET ("PFET"), said first value is tensile and said second value is compressive.

9. The method as claimed in claim 1, further comprising forming at least one isolation region, said isolation region defining a first semiconductor region and a second semiconductor region of a substrate, said first and second semiconductor regions being electrically isolated from each other, wherein said step of forming said first FET includes forming a first source region, a first channel region and a first drain region of said first FET in said first semiconductor region, and said step of forming said second FET includes forming a second source region, a channel region and a second drain region of said second FET in said second semiconductor region.

10. The method as claimed in claim 1, wherein said first and second gate conductors include top surfaces remote from said first and second channel regions, respectively, and said first and second stressed films overlie said top surfaces of said first and second gate conductors.

11. The method as claimed in claim 1, wherein each of said first and second stressed films are formed by a sequence of steps including depositing a first layer including a stressed material, etching back said first layer and subsequently depositing a second layer including said stressed material to overlie said first layer.

12. The method as claimed in claim 1, wherein each of said first and second stressed films includes consists essentially of a nitride.

13. The method as claimed in claim 12, wherein said first and second semiconductor regions consist essentially of silicon and said nitride includes silicon nitride.

14. The method as claimed in claim 13, wherein said stop layer includes an oxide of silicon.

15. A method of fabricating a semiconductor device structure, comprising:
    forming a first field effect transistor ("FET") and a second FET, one of said first and second FETs being an n-type FET and the other of said first and second FETs being a p-type FET, the first FET having a first gate conductor and the second FET having a second gate conductor, the first and second gate conductors being portions of a single elongated conductive member;

forming a first stressed film overlying said first and second FETs, said first stressed film applying a stress having a to a channel region of said first FET to enhance performance of said first FET, said first value being one of compressive or tensile;

forming a stop layer to overlie said first stressed film;

removing a portion of said first stressed film which overlies said second FET;

forming a second stressed film to overlie said second FET, said second stressed film applying a stress having a second value to said second FET to enhance performance of said second FET, said second value being one of compressive or tensile and other than said compressive or tensile stress of said first value;

planarizing said first and second stressed films until said stop layer is exposed, such that said first and second stressed films abut each other at a common boundary and present a substantially co-planar major surface at said common boundary.

* * * * *